(12) United States Patent
David et al.

(10) Patent No.: US 9,230,848 B2
(45) Date of Patent: Jan. 5, 2016

(54) PROCESS FOR FABRICATING A SILICON-ON-INSULATOR STRUCTURE

(71) Applicant: Soitec, Crolles Cedex (FR)

(72) Inventors: Carole David, Crolles (FR); Sébastien Kerdiles, Saint-Ismier (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/629,093

(22) Filed: Sep. 27, 2012

(65) Prior Publication Data

US 2013/0207244 A1 Aug. 15, 2013

(30) Foreign Application Priority Data

Oct. 3, 2011 (FR) ...................................... 11 58898

(51) Int. Cl.
| | | |
|---|---|---|
| *H01L 21/30* | (2006.01) | |
| *H01L 21/762* | (2006.01) | |
| *H01L 29/06* | (2006.01) | |
| *H01L 21/3105* | (2006.01) | |

(52) U.S. Cl.
CPC ...... *H01L 21/76254* (2013.01); *H01L 21/7624* (2013.01); *H01L 21/76251* (2013.01); *H01L 29/06* (2013.01); *H01L 21/3105* (2013.01)

(58) Field of Classification Search
CPC ................ H01L 21/7624; H01L 21/76251; H01L 21/76254
USPC ............................ 257/455–458; 438/455–458
See application file for complete search history.

(56) References Cited

U.S. PATENT DOCUMENTS

| | | | |
|---|---|---|---|
| 6,716,721 B2* | 4/2004 | Dietrich et al. ................ 438/455 |
| 7,276,428 B2 | 10/2007 | Daval et al. | |
| 8,404,563 B2* | 3/2013 | Hanaoka ........................ 438/458 |
| 2005/0014346 A1 | 1/2005 | Mitani et al. | |
| 2010/0022070 A1* | 1/2010 | Imahayashi .................... 438/458 |
| 2010/0155882 A1* | 6/2010 | Castex .......................... 257/507 |

(Continued)

FOREIGN PATENT DOCUMENTS

| | | |
|---|---|---|
| EP | 1811560 A1 | 7/2007 |
| EP | 1818976 A1 | 8/2007 |

(Continued)

OTHER PUBLICATIONS

Vincent et al., A model of interface defect formation in silicon wafer bonding, Applied Physics Letters, 94, 101914, (2009), 4 pages.

(Continued)

*Primary Examiner* — David Vu
*Assistant Examiner* — Brandon Fox
(74) *Attorney, Agent, or Firm* — TraskBritt

(57) ABSTRACT

Embodiments of the invention relate to a process for fabricating a silicon-on-insulator structure comprising the following steps: providing a donor substrate and a support substrate, only one of the substrates being covered with an oxide layer; forming, in the donor substrate, a weak zone; plasma activating the oxide layer; bonding the donor substrate to the support substrate in a partial vacuum; implementing a bond-strengthening anneal at a temperature of 350° C. or less causing the donor substrate to cleave along the weak zone; and carrying out a heat treatment at a temperature above 900° C. A transition from the temperature of the bond-strengthening anneal to the temperature of the heat treatment may be achieved at a ramp rate above 10° C./s.

19 Claims, 5 Drawing Sheets

(56) References Cited

U.S. PATENT DOCUMENTS

2012/0280355 A1* 11/2012 Akiyama ..................... 257/507

FOREIGN PATENT DOCUMENTS

| EP | 2352164 A1 | 8/2011 |
| FR | 2867307 A1 | 9/2005 |
| FR | 2911429 A1 | 7/2008 |
| WO | 2010049496 A1 | 5/2010 |

OTHER PUBLICATIONS

Vincent et al., Study of the formation, evolution, and dissolution of interfacial defects in silicon wafer bonding, Journal of Applied Physics, 107, 093513 (2010), 7 pages.

European Search Report for European Application No. 12187002.6-1235 dated Nov. 20, 2012, 6 pages.

* cited by examiner

PROCESS FOR FABRICATING A SILICON-ON-INSULATOR STRUCTURE

CROSS-REFERENCE TO RELATED APPLICATION

This application claims the benefit under 35 U.S.C. §119 (a) of French Patent Application FR1158898, filed Oct. 3, 2011, and entitled "Process for Fabricating a Silicon-On-Insulator Structure," the disclosure of which is hereby incorporated herein by this reference in its entirety.

TECHNICAL FIELD

The present invention relates to a silicon-on-insulator structure comprising a silicon layer, a buried oxide layer the thickness of which is 25 nm or less, and a support substrate, and to a process for fabricating such a structure.

BACKGROUND

Silicon-on-Insulator (SOI) structures are frequently used in Complementary Metal-Oxide-Semiconductor (CMOS) applications.

Such structures comprise, from their useful surface to their bottom side: a thin silicon layer; a buried layer made of a dielectric material that is typically an oxide, such as $SiO_2$; and a support substrate. The buried layer made of a dielectric material is often denoted by the acronym BOX for the term "Buried OXide."

The thicknesses of the thin silicon layer and the oxide layer may vary depending on the intended applications.

In particular, the thickness of the thin silicon layer is reduced to a thickness of 50 nanometers (nm) or less, even 20 nm or less, and especially to about 12 nm in order to allow what are called "FDSOI" ("Fully Depleted SOI") structures to be obtained. Such FDSOI structures have the advantage of significantly reducing operational instability and considerably improved performance relative to what are called "PDSOI" ("Partially Depleted SOI") structures in which the thickness of the thin silicon layer is about 70 to 90 nm. The improved performance may include low dynamic power, low leakage current, and/or high transistor density.

Among these structures, UTBOX (UTBOX standing for "Ultra-Thin Buried OXide") structures, having an ultrathin buried oxide layer, show great promise because the extreme thinness of this electrically insulating layer makes it possible to apply a voltage to the back side of the structure (i.e., to the side opposite the thin silicon layer) and therefore to precisely control the operation of the device.

The term "ultrathin" is understood to mean having a thickness of 50 nm or less.

The fabrication processes of structures having a buried oxide layer with a thickness of between 25 and 50 nm are, at the present time, quite well characterized and it is possible to produce such structures with a defectivity level that is compatible with subsequent component fabrication.

However, UTBOX structures with a buried oxide layer having a thickness of 25 nm or less, and particularly of 15 nm or less, can currently only be fabricated with a defectivity level that is not easily compatible with the requirements of component manufacturers.

More precisely, this defectivity is due to a bubbling or blistering effect that is observed at the bonding interface located between the thin silicon layer and the mechanical support, in the case of an SOI substrate fabricated using the SMART CUT® process.

FIG. 1 shows the variation in the defectivity as a function of the thickness of the BOX layer expressed in nanometers (nm).

The defectivity shown in this graph is the number of bubbles counted on the surface of an SOI structure immediately after the thin silicon layer has been transferred.

In the case of structures in which the BOX layer has a thickness below 15 nm (the hatched zone of the line in FIG. 1), the bubbling is so widespread that it may be impossible or impractical to count the bubbles.

FIGS. 2A to 2D illustrate the main steps of a first known process for fabricating such a structure employing the SMART CUT® process.

With reference to FIG. 2A, an oxide layer 2 is formed on the surface of a donor substrate 31 from which the thin silicon layer will be transferred.

A weak zone 32 is formed in the donor substrate 31, at a depth corresponding to the thickness of the thin layer 3 to be transferred, through the oxide layer 2, for example, by implantation of atomic species (represented by the arrows in FIG. 2B).

With reference to FIG. 2C, the donor substrate 31 (by way of the oxide layer 2) and the receiver substrate 1 are hydrophilically bonded by molecular adhesion.

This bonding step is followed by a bond-strengthening anneal intended to increase the bond strength.

Next, a supply of energy, for example, thermal energy, causes the donor substrate 31 to cleave in the weak zone 32.

In general, the bond-strengthening anneal is carried out at a low temperature (i.e., at a temperature between 200° C. and 550° C.) and the anneal allows the bonding interface to be strengthened and the cleaving of the donor substrate 31 to be initiated in the same step.

After the non-transferred part of the donor substrate 31 has been detached, a silicon-on-insulator structure (FIG. 2D) is obtained to which conventional finishing treatments (rapid thermal annealing (RTA), sacrificial oxidation, etc.) are applied, these treatments being intended to, inter alia, smooth the surface of the thin semiconductor layer 3 and repair implantation-related defects.

The one or more RTA treatments are typically carried out at a temperature above 900° C.

In the step of bonding the two substrates, water molecules present at the interface contribute to the bonding of the surfaces.

However, during the bond-strengthening anneal, water molecules diffuse through the oxide layer 2, and through a thin native-oxide layer on the surface of the receiver substrate 1, and react with the silicon of the semiconductor layer 3 and with the silicon of the receiver substrate 1. The reaction between the water molecules and the silicon may proceed as shown in the following oxidation reaction:

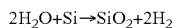

$$2H_2O + Si \rightarrow SiO_2 + 2H_2$$

This reaction produces molecules of hydrogen gas, which are trapped in the buried oxide layer, the buried oxide layer thus acting as a hydrogen-gas reservoir.

However, in the case of an ultrathin oxide layer, the layer is not thick enough to store all of the hydrogen gas molecules.

The buried oxide layer therefore becomes saturated and can no longer absorb the molecules of hydrogen gas. The excess hydrogen accumulates at the bonding interface where it generates defects.

This is because, as soon as the temperature of the bonded structure exceeds about 300° C., the hydrogen gas subjects defects present at the bonding interface to pressure, forming bubbles.

This effect is described in the following articles: "A model of interface defect formation in silicon wafer bonding," S. Vincent et al., *Applied Physics Letters*, 94, 101914, (2009); and "Study of the formation, evolution, and dissolution of interfacial defects in silicon wafer bonding," S. Vincent et al., *Journal of Applied Physics*, 107, 093513, (2010).

By carrying out an anneal at a temperature of between 300° C. and 400° C., the generation of hydrogen gas is limited and thus the bubbling effect is prevented.

Thus, after the cleaving, a structure with a very low defectivity is obtained.

However, the bonding interface still needs to be adequately strengthened and the SOI substrate still needs to be finished without allowing bubbles to appear in the finishing steps.

At temperatures of 900° C. and above, hydrogen gas is soluble in silicon.

After the cleaving, the objective is therefore to increase the temperature to 900° C. (a temperature above which hydrogen outgases from the silicon) rapidly enough to set the structure and thus to prevent generation of defects at the bonding interface.

However, after a conventional RTA treatment microbubbles are observed to form in the structure and, although these bubbles are much smaller than those observed after the known process described with reference to FIGS. 2A to 2D, they make it impossible to use the structures for the intended applications.

This is a result of the fact that during the RTA the temperature was not increased rapidly enough to set the structure and prevent the bubbling effect.

It is therefore still necessary to develop a process that prevents bubbles from forming in the case of structures in which the BOX layers are 15 nm or less in thickness, and, in particular, 10 nm or less in thickness.

To prevent $H_2$ from forming, document WO 2010/049496 describes a second process, the steps of which are represented in FIGS. 3A to 3E.

With reference to FIG. 3A, an oxide layer 21 is formed on the surface of the donor substrate 31.

A weak zone 32 is formed within the donor substrate 31 at a depth corresponding to the thickness of the thin layer 3 to be transferred, through the oxide layer 21, for example, by implantation of atomic species (represented by the arrows in FIG. 3B).

With reference to FIG. 3C, an oxide layer 22 is formed on the surface of the receiver substrate 1.

Next, molecular adhesion (oxide/oxide) bonding is used to bond the donor substrate 31 to the receiver substrate 1, the oxide layers 21, 22 being located at the interface and together forming the buried oxide layer 2 of the SOI substrate.

After this bonding step, the donor substrate 31 is cleaved at the weak zone 32.

This process achieves good results in terms of defectivity in so far as the $H_2$-generating reaction is limited by the presence of the two facing buried oxide layers 21, 22 that form a barrier to water-molecule diffusion.

Specifically, these molecules cannot reach the oxide/silicon interface, the silicon oxidation reaction cannot take place, and the generation of $H_2$ molecules is thereby prevented.

However, bonding substrates by way of their respective oxide layers 21, 22 have the drawback that the bonding interface is not completely closed. In other words, when the structure is observed with a transmission electron microscope after the finishing anneals (RTA at 1200° C. for 30 seconds), the interface between the two layers (represented by the dot-dash line 23 in FIG. 3E) may still be seen.

This incompletely closed interface may create electrical problems that could interfere with the operation of the electronic devices formed in or on the structure.

BRIEF SUMMARY

To produce a bond having a closed interface, the applicants have developed an oxide-to-silicon bonding process. In other words, a process in which the oxide layer intended to form the BOX layer is formed only on one of the two substrates, while leaving silicon on the free surface of the other substrate.

To produce such a bond, and with a view to closing the bonding interface, it is known to plasma activate the surface of the oxide. The plasma activation is intended to increase the bond strength.

However, such an activation increases the amount of water present at the interface and therefore risks further amplifying the bubbling effect that it is desired to prevent.

One aim of the invention is therefore to define a process for fabricating a silicon-on-insulator structure having a buried oxide layer, the thickness of which is 25 nm or less, and, in particular, 10 nm or less, allowing the formation of bubbles or blisters due to hydrogen to be prevented or at the very least reduced (e.g., minimized).

More precisely, the process may comprise an oxide-to-silicon bond having a completely closed bonding interface obtained without excessive heating of the structure.

Moreover, the process must be industrialisable on existing SOI-structure production lines.

Another aim of the invention is to provide a silicon-on-insulator structure comprising a buried oxide layer having a thickness of 25 nm or less, and, in particular, 10 nm or less, and having a very low "bubble" defectivity.

In accordance with the invention, a process is provided for fabricating a silicon-on-insulator structure comprising a silicon layer, a buried oxide layer having a thickness of 25 nm or less, and a support substrate, the process being characterized in that it comprises the following steps:

(a) providing a donor substrate comprising the silicon layer and the support substrate, only one of the substrates being covered with the oxide layer;

(b) forming, in the donor substrate, a weak zone bounding the silicon layer;

(c) plasma activating the oxide layer;

(d) bonding the donor substrate to the support substrate, the oxide layer being located at the bonding interface, the bonding being carried out in a partial vacuum;

(e) implementing a bond-strengthening anneal at a temperature of 350° C. or less, the anneal causing the donor substrate to cleave along the weak zone; and (f) applying, to the silicon-on-insulator structure, a heat treatment for repairing defects at a temperature above 900° C.—the transition from the cleaving temperature of step (e) to the defect-repairing temperature of step (f) being achieved at a ramp rate above 10° C./s.

The term "oxide" is understood in the present text to mean silicon dioxide ($SiO_2$).

The expression "partial vacuum" is understood to mean that the bonding step is carried out in a chamber in which the pressure is below atmospheric pressure, and in a moisture-free atmosphere (i.e., an atmosphere containing less than 100 ppm of water).

According to the invention, the bonding step employs a partial vacuum of between 0.1 mbar and 100 mbar, particularly of between 0.5 mbar and 10 mbar, and even more particularly of 1 mbar.

It is particularly advantageous for the anneal of the bond-strengthening step to be an anneal at a constant temperature lying between 300° C. and 350° C. of between 5 hours and 15 hours in length.

Optionally, additional mechanical energy may be applied to cleave the donor substrate during or after the bonding anneal.

An oxygen plasma may be employed in step (c) of activating the oxide layer.

Moreover, the thickness of the silicon layer, immediately after transfer of the thin layer by the SMART CUT® process, is advantageously 600 nm or less and may be between 270 nm and 510 nm, and may be equal to 330 nm.

In some embodiments of the invention, the thickness of the oxide layer may be 15 nm or less.

The formation of the weak zone may comprise implanting atomic species into the donor substrate.

Additional embodiments of the invention include a silicon-on-insulator structure comprising a silicon layer, a buried oxide layer having a thickness of 25 nm or less, and a support substrate, the structure being characterized in that the defectivity of the structure in terms of defect clusters is 60 or less.

According to some embodiments of the invention, the structure is a wafer having a diameter of 300 millimeters (mm).

The thickness of the silicon layer, after the SOI substrate has been finished, may be 50 nm or less, and particularly 20 nm or less, and even more particularly 12 nm.

BRIEF DESCRIPTION OF THE DRAWINGS

Other features and advantages of the invention will become clear from the following detailed description given with reference to the appended drawings in which.

In order to make the figures easier to understand, certain very thin layers have been enlarged and the various layers in the figures are therefore not drawn to scale.

DETAILED DESCRIPTION

The fabrication of a silicon-on-insulator structure having a buried oxide layer that is 25 nm or less in thickness will now be described.

To form such a structure, a donor substrate is provided from which a silicon layer, intended to form the ultrathin layer of the SOI wafer, may be transferred.

In so far as the final ultrathin layer results from thinning the transferred layer after the cleaving process, the thickness of the silicon layer transferred from the donor substrate is substantially larger than the thickness of the final silicon layer of the SOI substrate.

Thus, to form the ultrathin layer of silicon of an SOI substrate (i.e., having a thickness of 50 nm or less), a silicon layer having a thickness of 600 nm or less may be transferred from the donor substrate.

The donor substrate may be a single-crystal bulk silicon substrate.

Alternatively, the donor substrate may be a composite substrate. In other words, the donor substrate may comprise a multilayer structure including various materials, the surface layer of which comprises the single-crystal silicon layer to be transferred.

Figure 1:
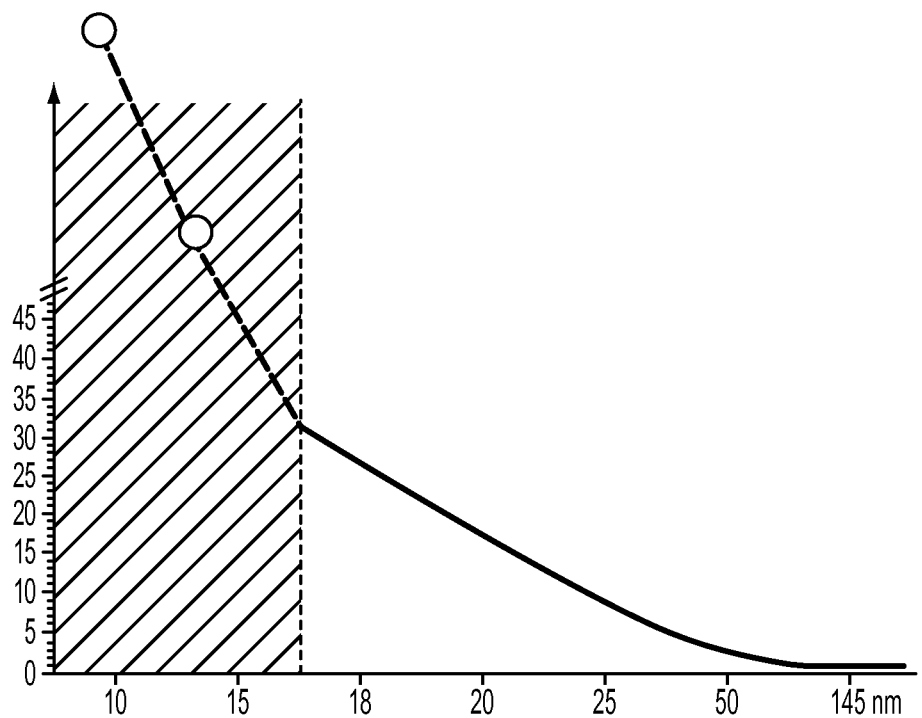
FIG. 1 is a graph illustrating the variation in the defectivity as a function of the thickness of the BOX layer in a silicon-on-insulator structure.
Figure 2A:
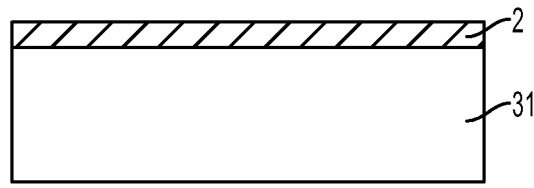
FIGS. 2A to 2D illustrate the various steps in a first known process for fabricating an SOI structure.
Figure 2B:
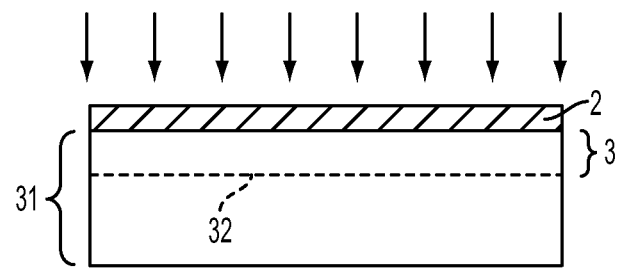
Figure 2C:
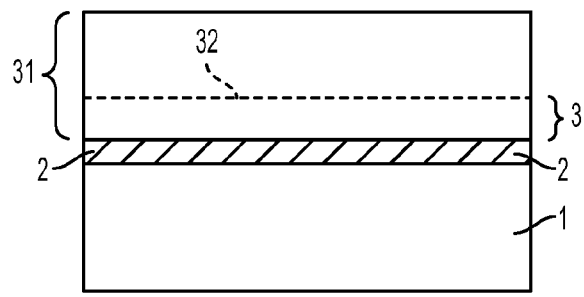
Figure 2D:
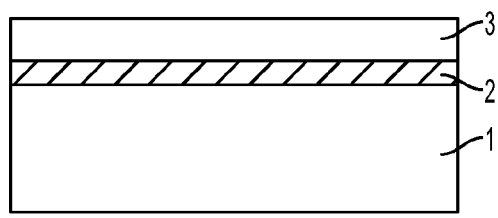
Figure 3A:
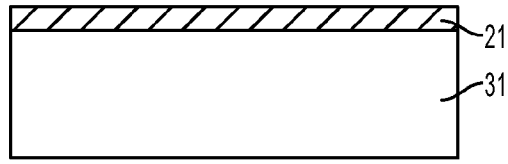
FIGS. 3A to 3E illustrate the various steps in a second known process for fabricating an SOI structure.
Figure 3B:
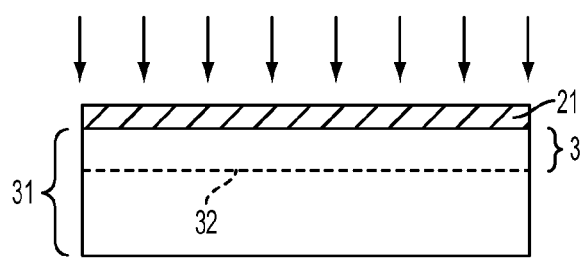
Figure 3C:
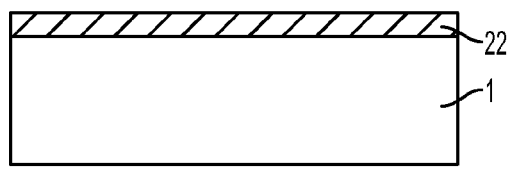
Figure 3D:
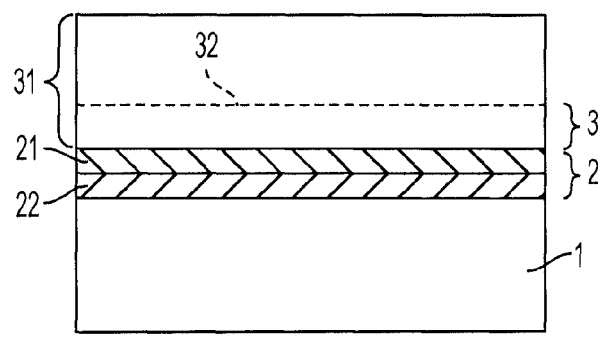
Figure 3E:
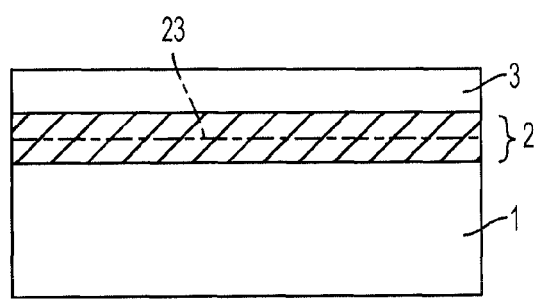
Figure 4A:
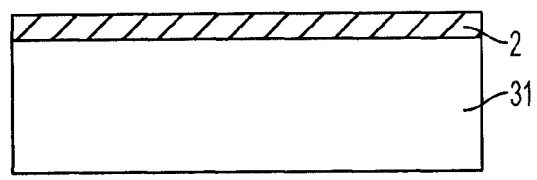
FIGS. 4A to 4E illustrate the various steps in the process for fabricating an SOI structure according to the invention.

With reference to FIG. 4A, an oxide layer 2 is formed on the surface of the donor substrate 31.

The oxide layer 2 is intended to form the buried oxide layer of the SOI structure.

The oxide layer 2, therefore, has a thickness of 25 nm or less, and may have a thickness of 15 nm or less.

Specifically, the surface of the donor substrate 31 may be thermally oxidized.

Alternatively, the oxide may be deposited, for example, by chemical vapor deposition (CVD).

Alternatively, the oxide layer 2 may be formed on the receiver substrate 1 (FIG. 4C) by exposing the silicon to the surface of the donor substrate 31.

However, it may be desirable to form the oxide layer 2 on the surface of the donor substrate 31, especially when a weak zone is formed by implantation of atomic species. This is because the implantation is then achieved through the oxide layer 2.

A weak zone is formed in the donor substrate, and the weak zone defines the silicon layer to be transferred.

Figure 4B:
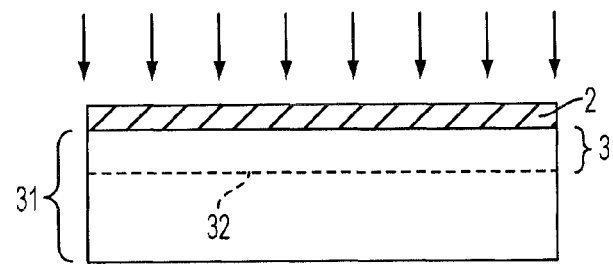

FIG. 4B shows the weak zone 32 being formed in the donor substrate 31 by implantation of atomic species, such as hydrogen and/or helium.

The implantation energy is chosen so that the weak zone 32 is formed at a depth substantially corresponding to the thickness desired for the layer 3 to be transferred (e.g., a thickness of 600 nm or less, particularly a thickness of between 210 and 570 nm, and even more particularly a thickness of about 330 nm).

However, the formation of the weak zone 32 is not restricted to an implantation process.

The weak zone 32 may also be formed by any technique that can introduce atomic species into the donor substrate 31 at the desired depth. For example, a diffusion technique may be used.

Figure 4C:
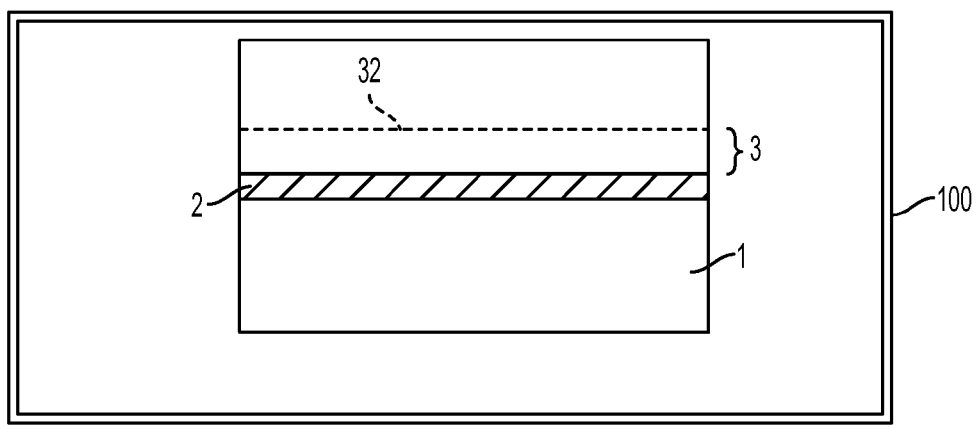

With reference to FIG. 4C, the donor substrate 31 is bonded by molecular adhesion to a receiver substrate 1 such that the oxide layer 2 is located at the interface.

The receiver substrate 1 is typically a silicon substrate, and optionally may be covered with a native oxide.

Thus, oxide-to-silicon (donor substrate-receiver substrate) bonding is obtained.

Alternatively, as indicated above, if the donor substrate 31 is not covered with the oxide layer 2 but has its silicon surface exposed, the oxide layer 2 would be formed on the receiver substrate 1 and an oxide-to-silicon (receiver substrate-donor substrate) would also be obtained.

By employing such a bonding step, there is no risk of an interface that is not completely closed being obtained, in contrast to the case of oxide-to-oxide bonding as mentioned in the introduction.

Before the substrates 1 and 31 are brought into contact, the oxide layer 2 located on the surface of the donor substrate 31 may be subjected to a plasma treatment.

In some embodiments, the plasma may be an $O_2$ plasma, but a plasma based on oxygen, argon, nitrogen and/or helium may also be employed.

The plasma treatment activates the surface of the oxide layer 2 and increases the bond strength.

The step in which the substrates 1 and 31 are brought into contact with a view to bonding them is carried out in a partial vacuum, generally at room temperature.

Specifically, the substrates 1 and 31 to be bonded are placed in a chamber 100, the interior of which may be depressurized.

Indeed, the Applicants have observed that carrying out the bonding step in a partial vacuum, and not at atmospheric pressure, allows the formation of bubbles to be substantially reduced.

In some embodiments, the absolute pressure of the partial vacuum lies between 0.1 mbar and 100 mbar, and, more particularly between 0.5 mbar and 10 mbar.

Even more advantageously, the Applicants have demonstrated that a partial vacuum with an absolute pressure of 1 mbar allows the presence of water at the bonding interface to be reduced (e.g., minimized) without adversely affecting the bonding quality. Sufficient bond strength is preserved to allow complete transfer of the layer and thus to avoid non-transferred zones being generated in the SOI structure.

In an SOI substrate, non-transferred zones (NTZs) are holes in the thin silicon layer where the silicon has not transferred to the receiver substrate. These defects are generally due to the bond between the transferred layer and the receiver substrate not being sufficiently strong.

Therefore, when reducing the amount of water at the interface, care should be taken to ensure that the bond between the substrates is sufficiently strong.

Furthermore, the atmosphere of the chamber 100 is moisture-free (i.e., an atmosphere containing less than 100 ppm of water).

This very low moisture content and the partial vacuum compensate for the additional water molecules contributed by the plasma treatment.

Thus, the amount of water at the bonding interface can be minimized (without, however, reducing the number of water molecules to zero since the bonding will not take place in the absence of water) while, by virtue of the plasma treatment, a bond that is sufficiently strong to prevent non-transferred zones is obtained.

Figure 5A:
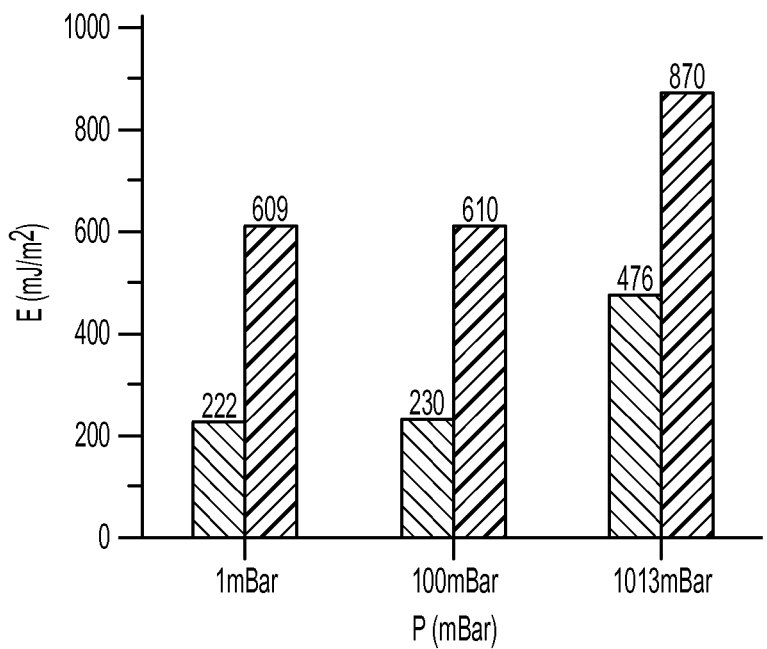
FIG. 5A is a histogram showing the bond strength as a function of the pressure during the bonding of the substrates.

FIG. 5A illustrates the bond strength E (expressed in $mJ/m^2$) for various pressure values P applied in the chamber 100 during the bonding.

This histogram shows the results of trials in which a donor substrate including a 10 nm-thick oxide layer that was or was not subjected to an $O_2$ plasma activation was bonded to a silicon receiver substrate at various pressures.

For each data pair, the left-hand column corresponds to the case where the bonding was carried out without prior plasma treatment of the substrate, whereas the right-hand column corresponds to the case where the bonding was preceded by an $O_2$ plasma treatment of the oxide layer covering the donor substrate.

It may be seen that, when the bonding is carried out in a partial vacuum, the bond strength is lower than when the bonding is carried out at atmospheric pressure (1013 mbar).

However, the bond strength varies little between 1 and 100 mbar, and a satisfactory value is obtained when a plasma treatment is applied to the donor substrate. Under these conditions, bonding in a partial vacuum does not lead to NTZs.

However, in the absence of the plasma treatment, the bond strength is too low and the number of non-transferred zones significantly increases.

Figure 5B:
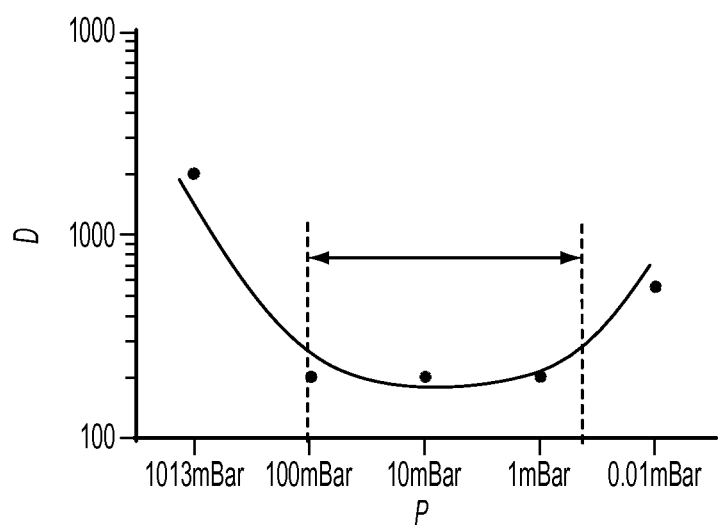
FIG. 5B is a graph illustrating the optimization of the pressure of the bonding in a partial vacuum with respect to the post-cleaving defectivity.

FIG. 5B illustrates the variation in the post-cleaving defectivity D (in terms of the number of bubbles and non-transferred zones) as a function of the pressure P applied in the chamber 100 during the bonding of the substrates.

This graph shows the results of trials in which a donor substrate with a 10 nm-thick oxide layer that was subjected to an $O_2$ plasma activation was bonded to a silicon receiver substrate at various pressures.

After the cleaving of the donor substrate, bubbles and non-transferred zones were counted using a visual inspection method.

It may be seen in this graph that the most advantageous pressure range (in terms of post-cleaving defectivity) lies between 0.1 mbar and 100 mbar.

A pressure of about one (1) mbar is the optimal pressure for minimizing the presence of water while also minimizing the defectivity. Furthermore, FIG. 5A confirms that a pressure as low as one (1) mbar is not disadvantageous in terms of bond strength and, therefore, in terms of NTZ defects.

It may therefore be concluded from the above that, to obtain a satisfactory compromise between bubble defects on the one hand and NTZ defects on the other hand, it is desirable both to carry out the bonding in a partial vacuum of between 0.1 and 100 mbar (e.g., about one (1) mbar) and to activate the surface of the donor substrate beforehand by means of a plasma treatment.

After the substrates 1 and 31 have been brought into contact, a bond-strengthening heat treatment is carried out that also has the effect of initiating the cleaving of the donor substrate 31 in the weak zone 32.

For this purpose, a tool (oven) other than the bonding tool is used.

This heat treatment may comprise an anneal carried out at a temperature of 350° C. or less at atmospheric pressure.

It may be particularly advantageous for the cleaving to initiate at a constant temperature lying between 300° C. and 350° C.

If the temperature of the anneal is too low (for example, lower than 250° C.) it may not sufficiently strengthen the bond and might therefore lead to non-transferred zones being formed.

The anneal may last a number of hours, such as from 5 hours to 15 hours.

During this anneal, the cleaving of the donor substrate 31 in the weak zone 32 is initiated.

The cleaving may be assisted or triggered by applying another energy source, such as an additional source of mechanical energy.

Thus, for example, a blade may be inserted into the weak zone 32.

As will be seen in more detail below, applying such a low-temperature bond-strengthening anneal, combined with bonding in a partial vacuum, unexpectedly allows the bubbling effect observed in the final SOI structure to be reduced.

Figure 4D:
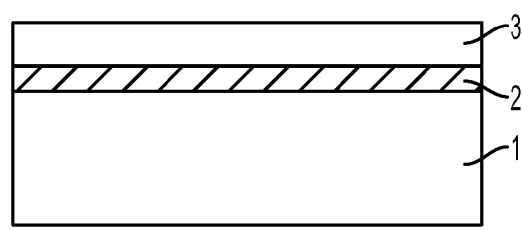

With reference to FIG. 4D, after the cleaving process, a structure comprising the receiver substrate 1, the oxide layer 2, and the transferred layer 3 is obtained.

Figure 4E:
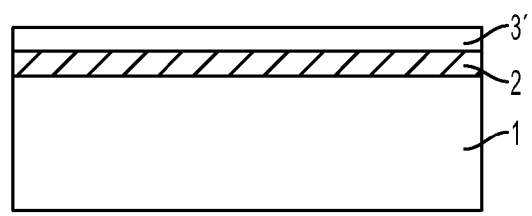

To form the final SOI structure (illustrated in FIG. 4E), various finishing treatments are carried out on the thin silicon layer.

After these treatments have been carried out, the final layer 3' is substantially thinner than the layer 3 that was transferred.

Moreover, an RTA treatment may be carried out to repair defects in the layer 3'.

The treatment may be carried out at a temperature above 900° C. (e.g., at about 1200° C.).

To prevent bubbles forming in the final SOI substrate, it may be desirable to reach the temperature of the RTA treatment rapidly.

Thus, it may be desirable to pass from the temperature of the bond-strengthening and cleaving anneal to the temperature of the RTA treatment at a ramp rate of at least 10° C. per second.

This is because a temperature rise that is this rapid allows the structure to be set and prevents the formation of bubbles.

This treatment may be carried out in a chamber equipped with an infrared lamp, allowing the treatment temperature plateau to be reached in a short time. It may be carried out in, for example, an oven or an epitaxial reactor.

Once a temperature of about 900° C. is reached, there is little or no risk of bubbling occurring because, above this temperature, outgassing of the hydrogen gas occurs.

The RTA treatment may last for about a number of seconds to a number of minutes (e.g., between 30 seconds and 15 minutes).

After this treatment, it is unimportant what ramp rate is used to return to room temperature since the hydrogen has diffused beyond the bonding interface and is, therefore, not capable of generating bubbles.

The influence of the transferred layer 3 has also been demonstrated by the Applicants.

Comparative trials were carried out with weak zones of 32 nm to 275 nm, 330 nm, and 510 nm.

The greater the depth of the weak zone, the smaller the number of bubbles observed after the cleaving process.

However, the closer the depth of the weak zone is to these limits, the greater the number of micro-bubbles observed after the RTA treatment.

The optimal thickness of the weak zone seems to be located at about 330 nm.

Moreover, it is important to note that the combination of bonding in a partial vacuum and a low-temperature bond-strengthening anneal results in an unexpected improvement in terms of bubbling.

Specifically, the Applicants have observed that implementing, in the known SMART CUT® process, either bonding in a partial vacuum or a low-temperature bond-strengthening anneal does not sufficiently reduce the bubbling.

The table below demonstrates the synergistic effect of these two treatments, relative to a known SMART CUT® process and a SMART CUT® process in which only one of these treatments is carried out.

The table shows, at various points in the process for fabricating an SOI substrate, the number of bubbles counted using a visual inspection method and/or using a KLA-Tencor SP2 inspection tool available from KLA Tencor of Milpitas, Calif.

In any case, the SOI structure is produced from a silicon donor substrate covered with a 25 nm-thick oxide layer and implanted with ions so as to form a weak zone at a depth of 330 nm, and from a silicon receiver substrate.

| Process Step | Known SMART CUT® process | SMART CUT® process with bonding in a partial vacuum (1 mbar) | SMART CUT® process with low-temperature (300° C.) anneal | SMART CUT® process with bonding at 1 mbar and 300° C. anneal (embodiment of the invention) |
|---|---|---|---|---|
| Post-cleaving (visual inspection) | Several hundred visible defects (essentially bubbles) | A few tens of visible defects (bubbles and NTZs) | No or very few visible defects (no bubbles) | No or very few visible defects (no bubbles) |
| Post-RTA (SP2 and visual inspection) | — | — | Extensive micro-bubbling observed by visual inspection | No bubbling observed either by visual or SP2 inspection |
| After sacrificial oxidation (SP2 inspection) | — | — | — | No bubbling observed |
| Final SOI substrate (SP2 inspection) | — | — | — | AC < 60 interface closed |

These data show that, for the known SMART CUT® process, bubbling may be widespread after the cleaving process. The bubbling was, therefore, not measured in subsequent steps of the process for fabricating this SOI substrate.

For the process in which the bonding was carried out at a pressure of one (1) mbar, a significant decrease in the bubbling was observed after the cleaving process.

However, the level of bubbling was still relatively high and, therefore, the bubbling was not measured in subsequent steps of the process for fabricating this SOI substrate.

For the process in which the bonding was carried out, in a known way, at atmospheric pressure, but in which a bond-strengthening and cleaving anneal was carried out at 300° C. (or less), bubbling was not observed.

However, after the RTA treatment, micro-bubbling was observed, visible to the naked eye, over substantially the entire surface of the SOI substrate. The term "micro-bubbling" is understood to mean small bubbles present in a high density.

Although small, these bubbles are not acceptable for SOI substrates that are so thin and therefore the bubbling was not measured in subsequent steps of the process for fabricating this SOI substrate.

Therefore, applied independently of one another, bonding in a partial vacuum and the bond-strengthening and cleaving anneal alleviate the bubbling effect after the cleaving process, but defects appear in subsequent steps, especially during the RTA treatment used to repair defects.

In other words, applied independently of one another, the bonding in a partial vacuum and the bond-strengthening and cleaving anneal simply seem to modify the bubbling effect, but do not allow it to be suppressed.

In contrast, combining these two treatments allows, at the end of the entire process for fabricating the SOI structure, a satisfactory level of bubbling to be obtained.

The sacrificial oxidation step carried out after the RTA treatment allows the useful layer of the SOI wafer to be thinned.

In the final SOI structure, the defectivity is measured in terms of defect clusters. The result of this measurement is called area count (AC).

A KLA Tencor SP2 inspection tool was used to make this measurement.

In this respect, the reader may refer to French Patent Number FR 2 911 429, published Jul. 18, 2008 (application number FR20070000192, filed Jan. 11, 2007), which describes a method and a system for detecting defect clusters.

Implementation of the process according to the invention allows an SOI structure having a defectivity, expressed in terms of defect clusters, of 60 or less, to be obtained.

What is claimed is:

1. A method for fabricating a silicon-on-insulator structure comprising a silicon layer, a buried oxide layer having a thickness of 15 nm or less, and a support substrate, the method comprising:
   providing a donor substrate comprising the silicon layer and the support substrate, only one of the donor substrate and the support substrate being covered with the oxide layer;
   forming, in the donor substrate, a weak zone bounding the silicon layer;
   plasma activating the oxide layer;
   bonding the donor substrate to the support substrate using an oxide-to-silicon molecular bonding process, the oxide layer being located at the bonding interface and having a thickness of 15 nm or less, the bonding being carried out in a partial vacuum of between 0.1 mbar and 100 mbar in an atmosphere containing less than 100 ppm of water;
   implementing a bond-strengthening anneal at a temperature of 350° C. or less, the bond-strengthening anneal causing the donor substrate to cleave along the weak zone; and
   applying, to the silicon-on-insulator structure, a heat treatment for repairing defects at a temperature above 900° C., the transition from the temperature of the bond-strengthening anneal to the temperature of the heat treatment being achieved at a ramp rate above 10° C./s.

2. The method of claim 1, further comprising carrying out the bonding in a partial vacuum of between 0.5 mbar and 10 mbar.

3. The method of claim 1, further comprising performing the bond-strengthening anneal at a temperature between 300° C. and 350° C. for a time between 5 hours and 15 hours.

4. The method of claim 3, wherein the silicon layer has a thickness of 600 nm or less.

5. The method of claim 4, wherein the silicon layer has a thickness between 270 nm and 510 nm.

6. The method of claim 5, wherein the silicon layer has a thickness equal to 330 nm.

7. The method of claim 1, wherein the silicon layer has a thickness of 600 nm or less.

8. The method of claim 7, wherein the silicon layer has a thickness between 270 nm and 510 nm.

9. The method of claim 8, wherein the silicon layer has a thickness equal to 330 nm.

10. The method of claim 1, further comprising performing the bond-strengthening anneal at a temperature between 300° C. and 350° C. for a time between 5 hours and 15 hours.

11. The method of claim 1, further comprising using mechanical energy to cause the donor substrate to cleave along the weak zone.

12. The method of claim 1, wherein plasma activating the oxide layer comprises using an oxygen plasma to activate the oxide layer.

13. The method of claim 1, wherein forming the weak zone in the donor substrate comprises implanting atomic species into the donor substrate.

14. The method of claim 1, wherein the buried oxide layer has a thickness less than 10 nm.

15. A silicon-on-insulator structure comprising a silicon layer, a buried oxide layer having a thickness of 15 nm or less, and a support substrate, wherein a defectivity of the structure in terms of defect clusters is 60 or less, and a bond strength between the buried oxide layer and the silicon layer or the support substrate at a bonding interface therebetween is at least about 600 mJ/m$^2$.

16. A silicon-on-insulator structure as recited in claim 15, wherein the silicon-on-insulator structure comprises a wafer having a diameter of about 300 mm.

17. A silicon-on-insulator structure as recited in claim 15, wherein a thickness of the silicon layer is 50 nm or less.

18. A silicon-on-insulator structure as recited in claim 17, wherein the thickness of the silicon layer is 20 nm or less.

19. A silicon-on-insulator structure as recited in claim 18, wherein the thickness of the silicon layer is about 12 nm.

* * * * *